United States Patent [19]

Yamamoto

[11] Patent Number: 5,512,769

[45] Date of Patent: Apr. 30, 1996

[54] HIGH BREAKDOWN VOLTAGE SEMICONDUCTOR DEVICE AND METHOD OF FABRICATING THE SAME

[75] Inventor: Masaharu Yamamoto, Otsu, Japan

[73] Assignee: Matsushita Electronics Corporation, Kadoma, Japan

[21] Appl. No.: 312,671

[22] Filed: Sep. 27, 1994

Related U.S. Application Data

[63] Continuation of Ser. No. 66,755, May 24, 1993, abandoned.

[30] Foreign Application Priority Data

May 25, 1992 [JP] Japan ..................................... 4-132186

[51] Int. Cl.⁶ ......................... H01L 29/94; H01L 31/062; H01L 31/113; H01L 31/119
[52] U.S. Cl. ........................ 257/339; 257/355; 257/336; 257/343; 257/344; 257/408; 257/409
[58] Field of Search ................................... 257/322, 335, 257/336, 337, 338, 339, 340, 341, 342, 343, 344, 408, 409, 492, 493

[56] References Cited

U.S. PATENT DOCUMENTS

| 4,878,100 | 10/1989 | McDavid | 257/408 |
|---|---|---|---|
| 5,061,649 | 10/1991 | Takenouchi et al. | 257/408 |
| 5,191,401 | 3/1993 | Shirai et al. | 257/344 |

FOREIGN PATENT DOCUMENTS

| 57-103355 | 6/1982 | Japan | 257/408 |
|---|---|---|---|
| 59-130472 | 7/1984 | Japan | 257/409 |
| 3120836 | 5/1991 | Japan | 257/344 |

OTHER PUBLICATIONS

Rat[0006]nam et al., "Drain Engineering of Hot–Corner-–Resistant MOSFETs Using Concave Silicon Surfaces for Deep Submicron VLSI Technology," Solid—State Electronics, vol. 33, No. 9, 1990, pp. 1163–1168.

Primary Examiner—Sara W. Crane
Assistant Examiner—Alice W. Tang
Attorney, Agent, or Firm—Rogers & Wells

[57] ABSTRACT

A high breakdown voltage semiconductor device is constituted, in either a semiconductor substrate or a lightly doped well diffused layer having deep diffusion depth, of a heavily doped diffused layer as a heavily doped drain diffused layer, a lightly doped diffused layer having deeper diffusion depth that the heavily doped diffused layer, and a lightly doped diffused layer adjacent to the heavily doped diffused layer called as an offset diffused layer. The heavily doped diffused layer functions as a part of the drain diffused layer, and has depth around 0.3 to 0.6 micron meter, and impurity concentration of $10^{19}$ to $10^{20}$ impurities/cm³. The width of the heavily doped diffused layer is set to 4 to 5 micron meters or greater. If the width of the heavily doped diffused layer is set less than this value, the breakdown voltage at an edge is lowered, and thereby impairment of the breakdown voltage occurs. The lightly doped diffused layer also functions as a part of the drain diffused layer. The lightly doped diffused layer is arranged, in particular, to relax the gradient of the impurity concentration of the drain diffused layer due to the heavily doped diffused layer. If the impurity concentration of the lightly doped diffused layer is too low, the resistance becomes high, so that adequate current can not be obtained. In the high breakdown voltage transistor, a gate electrode is formed above the edge of the lightly doped diffused layer. The breakdown voltage of the device is determined by the size of the offset diffused layer and its impurity concentration.

13 Claims, 6 Drawing Sheets

HIGH BREAKDOWN VOLTAGE SEMICONDUCTOR DEVICE AND METHOD OF FABRICATING THE SAME

This is a continuation of U.S. patent application Ser. No. 08/066,755 filed May 24, 1993, now abandoned.

BACKGROUND OF THE INVENTION

1. Field of the Invention

This invention relates to a high breakdown voltage MOS type semiconductor device and a method of fabricating the same and, more particularly, to a high breakdown voltage MOS type transistor device, a high breakdown voltage diffused resistor device, and a method of fabricating those devices.

2. Description of Related Art

As scale-down of semiconductor integrated devices proceeds in these days, not only MOS type transistors and memory devices but also semiconductor devices, such as peripheral circuits and input and output circuits, are fabricated in more shrunk size. MOS type high breakdown voltage semiconductor devices are used as microcontrollers for driving fluorescent display tubes, which are used as display devices of consumer products, such as video tuners, compact disc players, laser disc players, microwave ovens and the like. To drive such fluorescent display tubes, a power supply for about 30 Volt is generally required. Therefore, high breakdown voltage input and output circuits are needed in such semiconductor devices. As the size of display devices becomes larger, the number of the terminals of the high breakdown voltage input and output circuit increases, and amount of its drive current also increases. If this is tried to be satisfied, the periphery of the semiconductor chip tends to be entirely occupied with high breakdown voltage input and output circuits. Hence, miniaturization of the high breakdown voltage input and output circuits is inevitable for reducing the chip size of the semiconductor device. If the semiconductor device is fabricated in a smaller size, its breakdown voltage is generally lowered. Semiconductor devices for high breakdown voltage, therefore, must be designed so as to be enlarged up to a certain size or above in order to raise the breakdown voltage. This leads difficulty in scale-down of the high breakdown voltage semiconductor devices.

Figure 7:
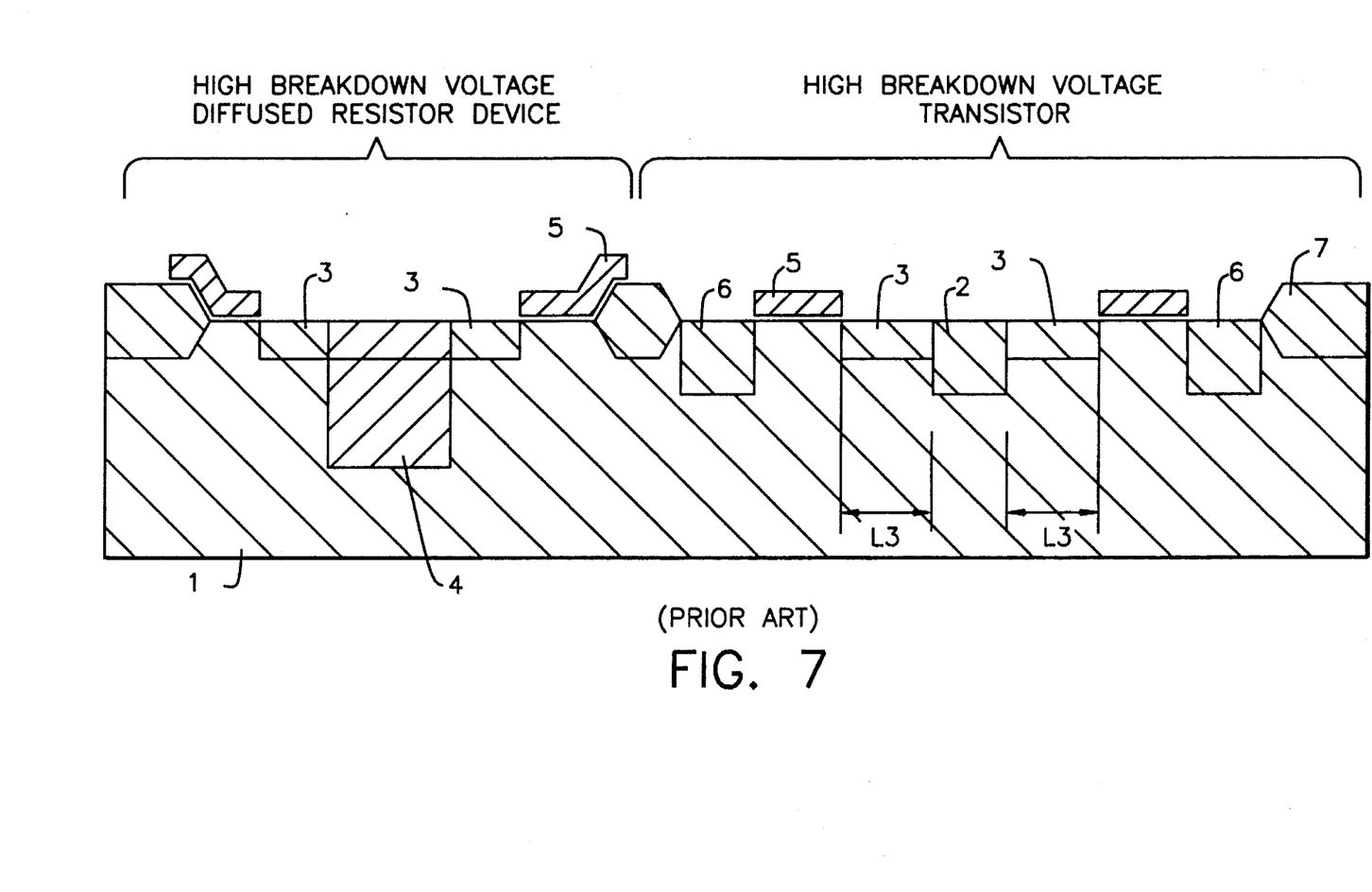
FIG. 7 is a cross section illustrating a conventional, high breakdown voltage semiconductor device.

FIG. 7 shows a cross section of a structure of conventional, high breakdown voltage diffused resistor and conventional, high breakdown voltage transistor. A p-type high breakdown voltage semiconductor will be described herein as an example. The semiconductor substrate is an n-type silicon substrate or an n-well diffused layer formed in a p-type semiconductor substrate, having deep diffusion depth. Generally, diffusions for p- and n-type wells, necessary for CMOS devices, are conducted by high temperature heat treatment to form the diffusion depth from 3 to 5 micron meters. A p-type well diffused layer formed during this process may be used as a lightly doped diffused layer 3 of a high breakdown voltage diffused resistor. In the case where the semiconductor substrate 1 is formed of the n-type deeply diffused well, the diffusion depth of the well must be 10 micron meters or greater in order to secure its withstand voltage. To diffuse 10 micron meters or greater in depth, high temperature heat treatment of 60 hours or longer is required, so that it is not practical in conjunction with mass production. Moreover, since the diffusion depth of the lightly doped diffused layer 3 is deep as of 3 to 5 micron meters, this is disadvantageous to shrink the size of the diffused resistor. Accordingly, in order to shrink the semiconductor device in size, it is necessary to let the diffusion depth be around 1 to 3 micron meters, shallow, through setting the time for high temperature heat treatment for forming the diffused layer 3 about one hours. In such cases, the lightly doped diffused layer 3 can be formed in an n-well. Such high temperature heat treatment is, however, conducted as an additional process after diffusion processes for p-well and n-well at the beginning of whole fabrication processes.

Furthermore, in the diffused resistor, a lightly doped diffused layer 3 is formed so as to be adjacent to and at the periphery of a lightly doped diffused layer 4, and gate electrodes 5 are formed at the outer periphery of the lightly doped diffused layer 3. On the other hand, at the drain of the high breakdown voltage transistor, the lightly doped diffused layer 3 is formed at the periphery of a heavily doped diffused layer 2, and, gate electrodes are formed at the outer periphery of the lightly doped diffused layer 3. The heavily doped diffused layer 2 is formed during a process for heavily doped source and drain diffused layers of an ordinary CMOS process. The lightly doped diffused layer 4 used in the high breakdown voltage diffused resistor, can not be used for the drain of the high breakdown voltage transistor.

With the constitution of conventional devices, the high breakdown voltage transistor must have a large gate width for obtaining a large amount of output current for driving fluorescent display tubes. Hence, the size of the transistor is larger than that of the high breakdown voltage diffused resistor. That is, the size of the high breakdown voltage transistor is necessary to be reduced to shrink a portion for high breakdown voltage.

SUMMARY OF THE INVENTION

It is an object of the invention to provide a high breakdown voltage semiconductor device in which lowering breakdown voltage is prevented to shrink the device in size and a method of fabricating this device.

According to a first aspect of the invention, a high breakdown voltage semiconductor device includes a heavily doped diffused layer of a second conductivity type formed in a semiconductor substrate of a first conductivity type, a first lightly doped diffused layer of the second conductivity type formed so as to surround the heavily doped diffused layer and formed so that a laterally protruding size of the first lightly doped diffused layer protruding from the heavily doped diffused layer is shorter than a vertically protruding size of the first lightly doped diffused layer protruding from the heavily doped diffused layer, and a second lightly doped diffused layer of the second conductivity type formed so as to be adjacent to the heavily doped diffused layer and formed so that a lateral size of the second lightly doped diffused layer is longer than the laterally protruding size of the first lightly doped diffused layer.

According to another aspect of the invention, a high breakdown voltage semiconductor device includes a heavily doped diffused layer of a second conductivity type formed in a semiconductor substrate of a first conductivity type, a first lightly doped diffused layer of the second conductivity type formed so as to surround the heavily doped diffused layer and formed so that a laterally protruding size of the first lightly doped diffused layer protruding from the heavily doped diffused layer is shorter than a vertically protruding size of the first lightly doped diffused layer protruding from the heavily doped diffused layer, a second lightly doped diffused layer of the second conductivity type formed so as to be adjacent to the heavily doped diffused layer and formed so that a lateral size of the second lightly doped diffused layer is longer than the laterally protruding size of the first lightly doped diffused layer, and a gate electrode formed on the semiconductor substrate through an insulation film.

According to yet another aspect of the invention, a high breakdown voltage semiconductor includes a drain diffused layer, a lightly doped diffused layer surrounding the drain diffused layer, a gate electrode formed in a ring shape at a periphery of the lightly doped diffused layer, a source diffused layer formed so as to surround the gate electrode, and a thick oxide film formed so as to surround the source diffused layer.

According to a further aspect of the invention, a method of fabricating a high breakdown voltage semiconductor device includes the steps of forming a high breakdown voltage transistor having both of a lightly doped diffused layer of a second conductivity type and a heavily doped diffused layer of a second conductivity type in either a semiconductor substrate of a first conductivity type or a lightly doped well of the first conductivity type, forming a first lightly doped diffused layer having deeper diffusion depth than that of the heavily doped diffused layer at both of the transistor and a resistor at the same time during the same step, and forming a second lightly doped diffused layer of a second conductivity type serving as an offset diffusion at both of the transistor and a resistor at the same time during the same step.

According to an even further aspect of the invention, a method of fabricating a high breakdown voltage semiconductor device comprising the steps of forming a lightly doped well of a second conductive type in the semiconductor substrate of a first conductivity type, forming a p-type well and an n-type well for CMOS devices in the semiconductor substrate, forming a first lightly doped diffused layer of a first conductivity type in the lightly doped well, forming a second lightly doped diffused layer of a first conductivity type used as an offset diffused layer before a side wall for a gate electrode is formed, forming the side wall for the gate electrode, and forming a heavily doped diffused layer serving as a source or a drain of the transistor.

With constitutions of the semiconductor device and methods of fabricating the device according to the invention, electric field intensity at the edge of the drain is relaxed by adding the lightly doped diffused layer. The breakdown voltage characteristics of the high breakdown voltage transistor is more improved, and a protrusion of the lightly doped diffused layer toward the offset diffused layer is more reduced in size. Therefore, misalignments of the masks during fabricating processes and impairments of breakdown voltage due to disunity of diffusion depth are suppressed, and an offset size, even the scale of the high breakdown voltage semiconductor device in whole, can be reduced.

BRIEF DESCRIPTION OF THE DRAWINGS

The above and other objects and features of the invention are apparent to those skilled in the art from the following preferred embodiments thereof when considered in conjunction with the accompanied drawings, in which:

FIGS. 6 (a) to 6(f) are cross sections illustrating sequentially a process of fabricating a high breakdown voltage semiconductor device according to a preferred embodiment of the invention.

DETAILED DESCRIPTION OF THE PREFERRED EMBODIMENTS

Referring to the drawings in detail, a semiconductor device according to a preferred embodiment of the invention is shown.

Figure 1:
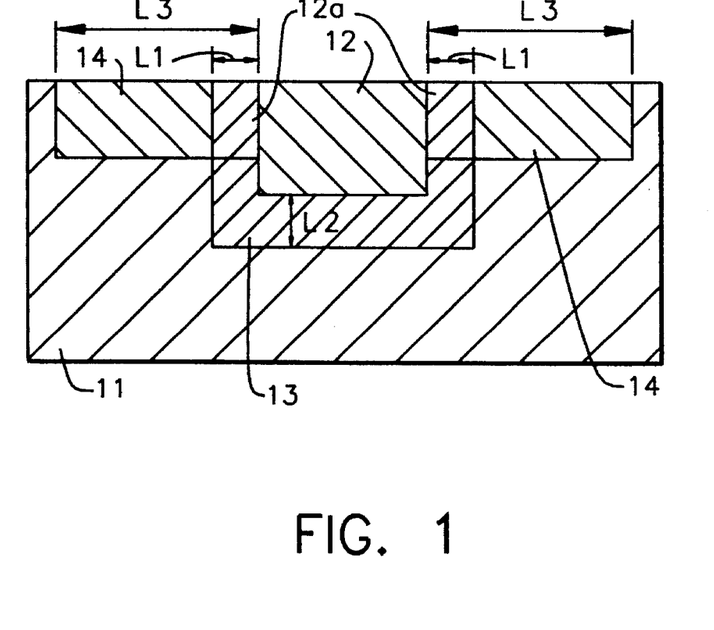
FIG. 1 is a cross section illustrating a diffused structure of a high breakdown voltage semiconductor device according to a preferred embodiment of the invention.

In FIG. 1, a cross section showing the semiconductor device for describing a positional relation of a lightly doped diffused layer mainly applied to a drain of the device, is shown. The high breakdown voltage semiconductor device is constituted, in a semiconductor substrate 11, of a heavily doped diffused layer 12 as a heavily doped drain diffused layer, a lightly doped diffused layer 13 having deeper diffusion depth than that of the heavily doped diffused layer 12, and a lightly doped diffused layer 14 adjacent to the heavily doped diffused layer 12 called as an offset diffused layer. The semiconductor substrate 11 can be formed of a lightly doped well diffused layer having deep diffusion depth. In this embodiment, a silicon substrate of n-type conductivity is used as the semiconductor substrate 11. The impurity concentration of the semiconductor substrate 11 is in a range from $10^{15}$ to $10^{16}$ impurities/cm$^3$. If the impurity concentration is lower than $10^{15}$ impurities/cm$^3$, the breakdown voltage between channels becomes lower, thereby resulting in impairment of the breakdown voltage. If the impurity concentration is higher than $10^{16}$ impurities/cm$^3$, impairment of the breakdown voltage within the substrate may occur. The heavily doped diffused layer 12 functions as a part of the drain diffusion, whose conductivity is a p-type, and whose depth is in a range from 0.3 to 0.6 micron meters, approximately. The impurity concentration of the heavily doped diffused layer 12 is in a range from $10^{19}$ to $10^{20}$ impurities/cm$^3$. The width of the heavily doped diffused layer 12 is set to 4 to 5 micron meters or greater. If the width of the heavily doped diffused layer 12 is set to be shorter than that length, the breakdown voltage at the edge is lowered, so that impairment of the breakdown voltage occurs. The lightly doped diffused layer 13 also functions as a part of the drain diffused layer. This layer 13 is provided in particular for relaxing the gradient of impurity concentration of the drain diffused layer due to the heavily doped diffused layer 12. The conductivity type of the lightly doped diffused layer 13 is the p-type, and the depth thereof is in a range from 1 to 3 micron meters, approximately. The impurity concentration of the lightly doped diffused layer 13 is about $10^{16}$ impurities/cm$^3$. If its impurity concentration becomes too light, resistance thereof increases, and thereby adequate current can not be obtained.

In FIG. 1, numeral L1 is protruding size of the lightly doped diffused layer 13 protruding from the heavily doped diffused layer 12 in a lateral direction. Numeral L2 is protruding size of the lightly doped diffused layer 13 protruding from the heavily doped diffused layer 12 in a vertical, or depth, direction. Numeral L3 is length of the lightly doped diffused layer 14, as the offset diffused layer, between the edges of the gate electrode and the heavily doped diffused layer or an offset size.

In the high breakdown voltage transistor, a gate electrode 15 is formed above the edge of the lightly doped diffused layer 14. The location of the edge of the lightly doped diffused layer 14 is needed to be identical to the location of the edge of the gate electrode 15, or to enter below the gate electrode 15. If spacing exists between the gate electrode 15 and the lightly doped diffused layer 14, electric current is prone to flow uneasily, and thereby impairment occurs upon the output current characteristics. Therefore, forming the lightly doped diffused layer 14 is necessary prior to forming side wall films 24 located on sides of the gate electrode 15.

The breakdown voltage characteristics of this device is mainly determined by electric field concentration at the edge of the heavily doped diffused layer 12, impurity concentration of the lightly doped diffused layer 14, electric field concentration at the edge of the lightly doped diffused layer 14 and the gate electrode, and even withdraw voltage against punchthrough at a channel occurring immediately below the gate electrode 15 or the like. Particularly, dominative parameters are the size L3 of the offset diffused layer and its impurity concentration. The edge of the heavily doped diffused layer 12 is herein defined as both of the edge on the surface of the substrate and the edge inside of the substrate. The electric field concentration occurs when voltage is applied to the heavily doped diffused layer 12. In particular, the electric field concentration occurs at a corner of the diffused layer where voltage gradient is steep. In the case that the electric potential of the lightly doped diffused layer 14 is higher than the electric potential of the gate electrode 15, the gradient of the electric potential becomes steep at a portion where spacing between the lightly doped diffused layer 14 and the gate electrode 15 becomes the narrowest, so that electric concentration occurs. The punchthrough at channels tends to occur in the case that the spacing between the gate electrodes is short or that doping of the substrate is light. Punchthrough occurs when a depletion layer of the drain diffused layer extends laterally and reaches the source diffused layer.

The breakdown voltage of the high breakdown voltage semiconductor device having an offset structure is mainly determined by length L3 and impurity concentration. The resistance of the lightly doped diffused layer 14, or so called as offset resistance or pinch resistance, reduces the voltage applied to the drain diffused layer. The resistance value is determined by the length between both ends of the diffused layer and its resistivity. Therefore, the longer the size L3, the higher the resistance value, and the heavier the impurity concentration, the lower the resistance value and the smaller the drop of the voltage. The impurity concentration of the lightly doped diffused layer 14 is controlled by dose amount of the ion implantation. If the dose amount of the ion implantation is much, the resistance of the offset diffused layer decreases, thereby reducing a voltage drop at the offset portion, and thereby increasing voltage exerting to the edge of the gate electrode 15. The breakdown voltage of the gate electrode 15 is a withdraw voltage between the semiconductor substrate 11 and the gate electrode 15 via an oxide film 21. This withdraw voltage is determined by the nature and the thickness of the oxide film 21. If the breakdown voltage is low, the oxide film is damaged, and impairment of its reliability occurs. As a result, the voltage applied to the gate electrode 15 is shunted to the semiconductor substrate 11, and then, current leakage occurs. The breakdown voltage of the edge of the gate electrode 15 dominates the breakdown voltage of the entire transistor. Therefore, if the dose amount of the ion implantation is much, the breakdown voltage of the transistor is lowered. To the contrary, if the dose amount of the ion implantation is less, the resistance of the lightly doped diffused layer 14 is higher, thereby increasing voltage drop at the offset portion. This leads that the voltage applied to the edge of the gate electrode is forced to be lower than the breakdown voltage of the edge of the gate electrode 15, thereby improving the breakdown voltage of the transistor. However, if the dose amount is more less, the breakdown voltage begins to be lowered. This is because the concentration of the lightly doped diffused layer 14 around the edge 12a of the drain in the heavily doped diffused layer 12 becomes too light, and therefore, electric field concentrates much at the edge 12a of the drain. This causes inadequate electric field's relaxation at the edge 12a of the drain.

In order to avoid such difficulties, it is necessary to form the lightly doped diffused layer 13 only around the edge 12a of the drain. Electric field intensity is relaxed by the lightly dopes diffused layer 13. Namely, the lightly doped diffused layer 13 is formed in order to avoid the impurity concentration of the entire lightly doped diffused layer 14 as the offset diffused layer to be increased, or to increase the impurity concentration only of the edge of the drain diffused layer, locally. With formation of the lightly doped diffused layer 13, if the protruding size L1 of the lightly doped diffused layer 13 in the lateral direction is too long, superimposed portion of the lightly doped diffused layers 13, 14 becomes large. At that superimposed portion, the impurity concentration is much higher, and therefore, the resistance of the entire offset diffused layer is lowered, so that the breakdown voltage is lowered.

Figure 2:
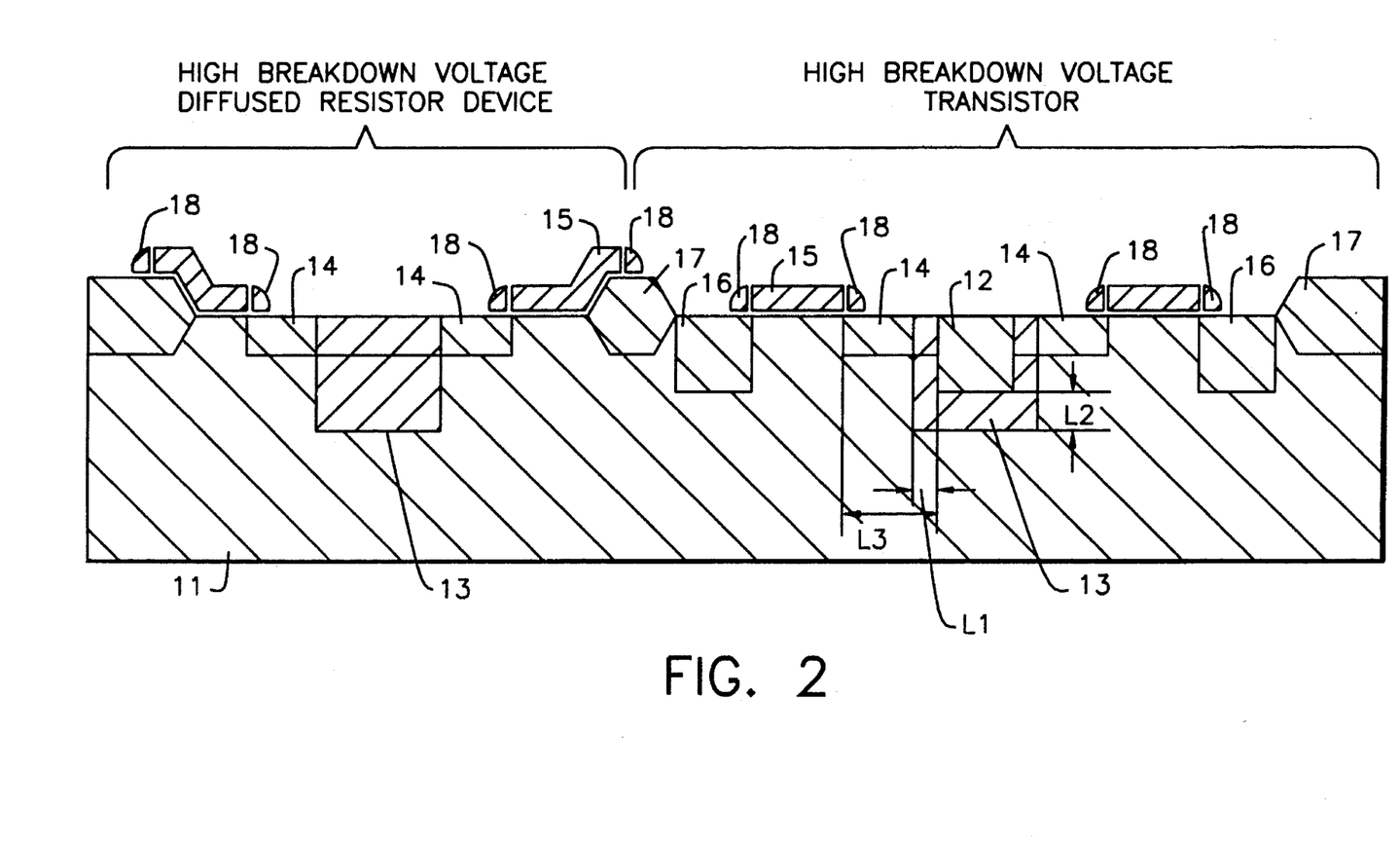
FIG. 2 is a cross section illustrating a high breakdown voltage diffused resistor and a high breakdown voltage transistor according to the invention.

FIG. 2 is a cross-sectional view illustrating a high breakdown voltage diffused resistor and a high breakdown voltage transistor according to a second embodiment of the invention.

The high breakdown voltage resistor includes the lightly doped diffused layer 13 having diffusion depth deeper than that of the heavily doped diffused layer 12 of the drain. The lightly doped diffused layer 13 is formed so as to contain or to surround the heavily doped diffused layer 12 of the high breakdown voltage transistor. The semiconductor substrate 11 is either a silicon substrate or an n-type lightly doped well diffused layer having deep diffusion depth. The heavily doped diffused layer 12 used as a heavily doped drain diffused layer is formed at a predetermined region of the semiconductor substrate 11 for forming the high breakdown voltage transistor. The lightly doped diffused layer 13 having deeper diffusion depth than the heavily doped diffused layer 12 is formed. The lightly doped diffused layer 13 is formed at a region of the semiconductor substrate 11 for forming another high breakdown voltage diffused resistor. The lightly doped diffused layers 14 as the offset diffused layer are formed on left and right sides of the heavily doped diffused layer 12 so as to be adjacent to the heavily doped diffused layer 12.

In the high breakdown voltage resistor, the lightly doped diffused layer 14 is formed on the surface of the substrate, and the lightly doped diffused layer 13 having deeper diffusion depth than the lightly doped diffused layer 14 is formed inside of the lightly doped diffused layer 14. On the other hand, in the high breakdown voltage transistor, the heavily doped diffused layer 12 is formed inside of the lightly doped diffused layer 14. Moreover, the lightly doped diffused layer 13 is formed so as to surround the heavily doped diffused layer 12 and so as to contain a part of the lightly doped diffused layer 14. The spacing from a side wall of the heavily doped diffused layer 12 on a side to a side wall of the lightly doped diffused layer 13 on the same side is indicated as the protruding size L1 in the lateral direction. The spacing from the bottom of the heavily doped diffused layer 12 to the bottom of the lightly doped diffused layer 13 in the vertical, or depth, direction is indicated as the protruding size L2. The spacing of the lightly doped diffused layer 14 adjacent to one of side faces of the heavily doped diffused layer 12 in the lateral direction is indicated as the offset size L3.

The role of the lightly doped diffused layer 13 in the high breakdown voltage resistor is mainly to set resistance value. The diffusion depth of the lightly doped diffused layer 13 is in a range from 1 to 3 micron meters. If the depth is too deep, in the case that the high breakdown voltage semiconductor device is formed in a well, the diffusion depth of the well must be deep adequately, and enough withdraw voltage can not be obtained unless high temperature heat treatment is conducted for 60 hours or greater. If the depth is too shallow, radius of curvature becomes small, and the lightly doped diffused layer 13 lowers the breakdown voltage thereof per se. Hence, the diffusion depth of the lightly doped diffused layer 13 is set from 1 to 3 micron meters. In the embodiment, the resistance value of the lightly doped diffused layer 13 is about 100 kilo ohm.

In the high breakdown voltage resistor, the p-type lightly doped diffused layer 14 is formed so as to be of 0.2 to 1 micron meter in depth and with impurity concentration of $10^{16}$ impurities/cm$^3$, approximately. The lightly doped diffused layer 14 is employed for a diffused resistor for control. The p-type lightly doped diffused layer 13 is formed so as to be of 1 to 3 micron meters and with impurity concentration of $10^{16}$ impurities/cm$^3$. The lightly doped diffused layer 13 is employed mainly for a diffused resistor.

The resistance value of the high breakdown voltage resistor is mainly determined by the lightly doped diffused layer 13. In order to improve the breakdown voltage of the edge, the lightly doped diffused layer 14 is subsidiarily added to a shallow region of the surface of the semiconductor substrate 11, and is controlled to reduce the resistance value. In particular, forming the lightly doped diffused layer 14 on the surface allows the impurity concentration on a surface side to be high on a side of the lightly doped diffused layer 13, thereby working for suppressing elevation of the resistance due to substrate bias effect occurring when applied voltage is raised. This is because if the resistance is too high, the width of the depletion layer becomes large when high voltage is applied, so that the resistance value rises.

The heavily doped source diffused layer 16 is formed at a position spaced from the lightly doped diffused layer 14 in the high breakdown voltage transistor on the semiconductor substrate 11. Since the lightly doped diffused layers 14 are formed on the both sides of the heavily doped diffused layer 12, the heavily doped source diffused layers 16 are also arranged corresponding to the respective lightly doped diffused layers 14. The p-type heavily doped source diffused layer serving as an electrode is formed so as to be of 0.3 to 0.6 micron meter in depth and with impurity concentration of $10^{19}$ to $10^{20}$ impurities/cm$^3$.

Between the high breakdown voltage transistor and the high breakdown voltage diffused resistor, a thick oxide film 17 is formed to electrically isolate therebetween. The gate electrode 15 is formed on the semiconductor substrate 11 via an insulating film. In the high breakdown voltage diffused resistor, the gate electrode 15 is formed at a region from the side edge of the lightly doped diffused layer 14 to the thick oxide film 17. In the high breakdown voltage resistor, since the lightly doped diffused layers 14 are arranged on the both sides of the lightly doped diffused layer 13, the gate electrodes 15 are formed so as to extend from the edge of the lightly doped diffused layers 14. In the high breakdown voltage transistor, the heavily doped diffused layer 12 is the drain, and the heavily doped source diffused layer 16 is the source. The gate electrode 15 is formed on the substrate between the source and the drain via the insulating film. Side wall films are arranged at the side walls of the gate electrode 15. According to positions for forming the lightly doped diffused layers 13,14, the breakdown voltage may impair as the spacing from the lightly doped diffused layer 13 to the gate electrode 15 becomes shorter, but no problem rise if the spacing is 4 micro meters or greater.

Figure 3:
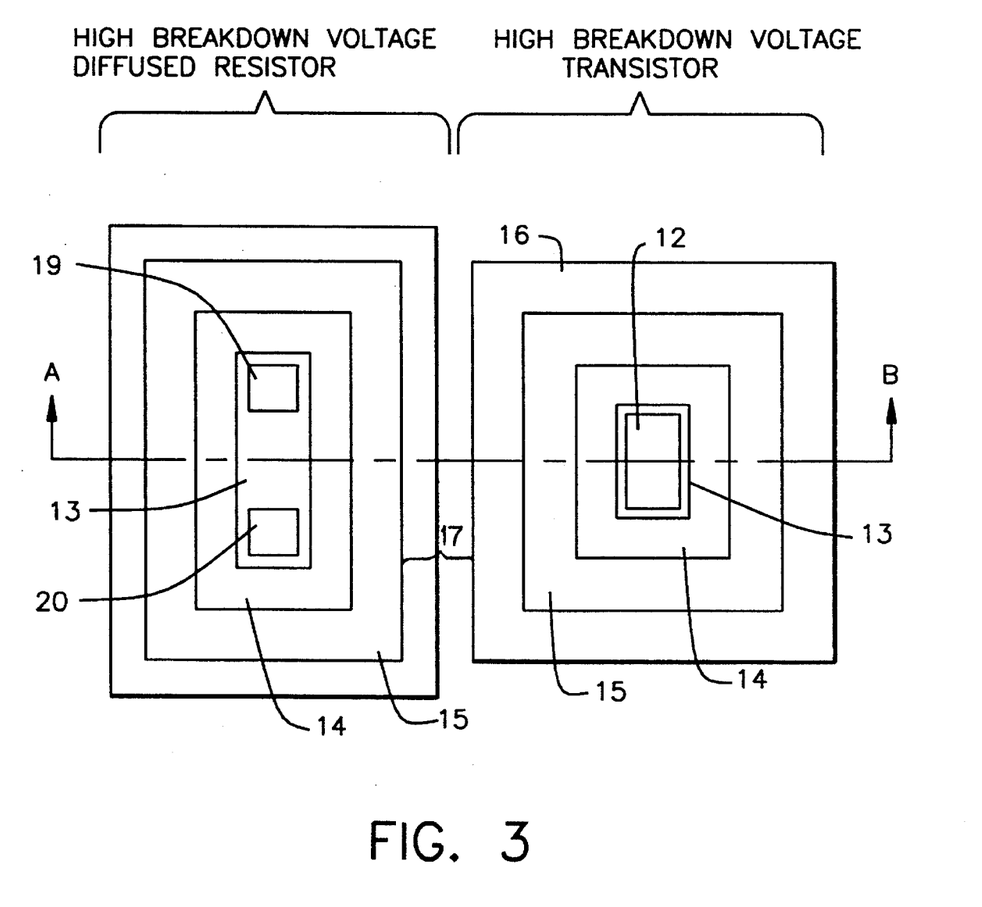
FIG. 3 is a plan view illustrating a high breakdown voltage diffused resistor and a high breakdown voltage transistor according to the invention.

FIG. 3 is a plan view of the semiconductor device shown in FIG. 2. FIG. 2 shows a cross section taken along single dotted chain line A–B of FIG. 3, which illustrates a plan of the high breakdown voltage semiconductor device mounting the high breakdown voltage transistor and the high breakdown voltage resistor at the same time.

In the high breakdown voltage semiconductor device, the lightly doped diffused layer 14 is formed so as to surround the rectangular drain diffused layer. The gate electrode 15 is formed in a rectangular ring shape at the periphery of the lightly doped difused layer 14. The source diffused layer 16 is formed at the outer periphery of the gate electrode 15. The gate electrode 15 controls current flowing between the source diffused layer 16 and the drain diffused layer. In the high breakdown voltage resistor, the lightly doped diffused layer 14 is formed so as to surround the lightly doped diffused layer 13. The gate electrode 15 is formed at the periphery of the lightly doped diffused layer 14. Heavily doped diffused layers 19, 20 as two electrodes are formed in the lightly doped diffused layer 13, and the diffused resistor is given between these two electrodes. The heavily doped diffused layers 19, 20 contact with metal electrodes, respectively. The reason that the gate electrode 15 is formed at the outer periphery of the lightly doped diffused layers 13, 14 is to prevent the breakdown voltage of the lightly doped diffused layers 13, 14 as high breakdown voltage portions from lowering. That is, in order to avoid the lightly doped diffused layer 14 to contact with the thick oxide film 17, the gate electrode 15 made of polycrystalline silicon is formed thereat. When the lightly doped diffused layer 14 is formed, ion implantation is conducted so as to be self-aligned using the gate electrode 15 as a mask.

Although the gate electrode 15 overlaps a part of the thick oxide film 17, the overlapped portion is 1 micron meter or greater, and if the gate electrode 15 extends 2 micron meters or grater on the insulating film successive to the thick oxide film 17, the breakdown voltage can be avoided from lowering. The ring shaped gate electrode 15 collects much electric current. Disposing the source diffused layer 16 around the drain diffused layer of the high breakdown voltage portion allows the breakdown voltage not to be lowered. This is because if the drain diffused layer as the high breakdown voltage portion and the thick oxide film 17 are connected with each other, the breakdown voltage of the diffused layer formed below the thick oxide film 17, serving as a channel stopper, may be lowered.

The reason that the side wall films 18 are formed on the both sides of the gate electrode 15 of the high breakdown voltage transistor is to prevent punchthrough withdraw voltage from lowering since the punchthrough withdraw voltage tends to be lowered in accordance with scale-down of the device. In other words, spread of the source diffused layer and the drain diffused layer in the lateral direction is being suppressed by forming the side wall films 18. In the high breakdown voltage resistor, existence of the side wall film 18 dose not affect the performance of the resistor, and the side wall film 18 on a side of the resistor is formed during fabricating process for the side wall film 18 for the transistor, simultaneously. If the side wall film 18 exists, adequate current may not be available in the high breakdown voltage transistor. Therefore, before the side wall film 18 is formed, the lightly doped diffused layer 14 is formed. Moreover, the offset size L3 of the lightly doped diffused layer 14 of the high breakdown voltage transistor, the protruding size L1 of the lightly doped diffused layer 13 from the heavily doped diffused layer 12 in the lateral direction, and the protruding size L2 in the vertical direction are in the same positional relation to those of the structure described in the first embodiment. In this embodiment, a number of the high breakdown voltage transistors of FIG. 3 can be arranged in parallel to handle the output current when seen from their cross section, whereas the high breakdown voltage resistor can be provided exclusively.

As described above, the lightly doped diffused layer 14 serving as the offset diffused layer is formed not only at the high breakdown voltage transistor but also the high breakdown voltage resistor, and controls the resistance and voltage dependency of the high breakdown voltage resistor. Forming the lightly doped diffused layer 14 as the offset diffused layer over the lightly doped diffused layer 13 can reduce the surface resistance. According to this, when a high voltage is applied to the electrode of the diffused resistor, the depletion layer in the diffused layer stretches in a fashion that the depletion layer stretches less on the surface side, and resistance dependency due to voltage becomes less. Therefore, even when a high voltage is applied, the resistance is not raised extremely. The lightly doped diffused layer 14 controls the breakdown voltage of the high breakdown voltage transistor as already described. If dose amount of the ion implantation is reduced and the resistance of the lightly doped diffused layer 14 is raised, the breakdown voltage is likely to increase, but output current thereof decreases.

Thus, in the invention, the lightly doped diffused layer 13 and the lightly doped diffused layer 14 as the offset diffused layer are formed at both of the high breakdown voltage resistor and the high breakdown voltage transistor at the same time during respective processes, and characteristics of the breakdown voltage and of output current are controlled at the same time. The size L3 of the diffused resistor can be set to a larger size, 4 micron meters or above, than the size L3 of the high breakdown voltage transistor, which is equal to 3 micron meters, in order to give the resistor more spacing.

Figure 4:
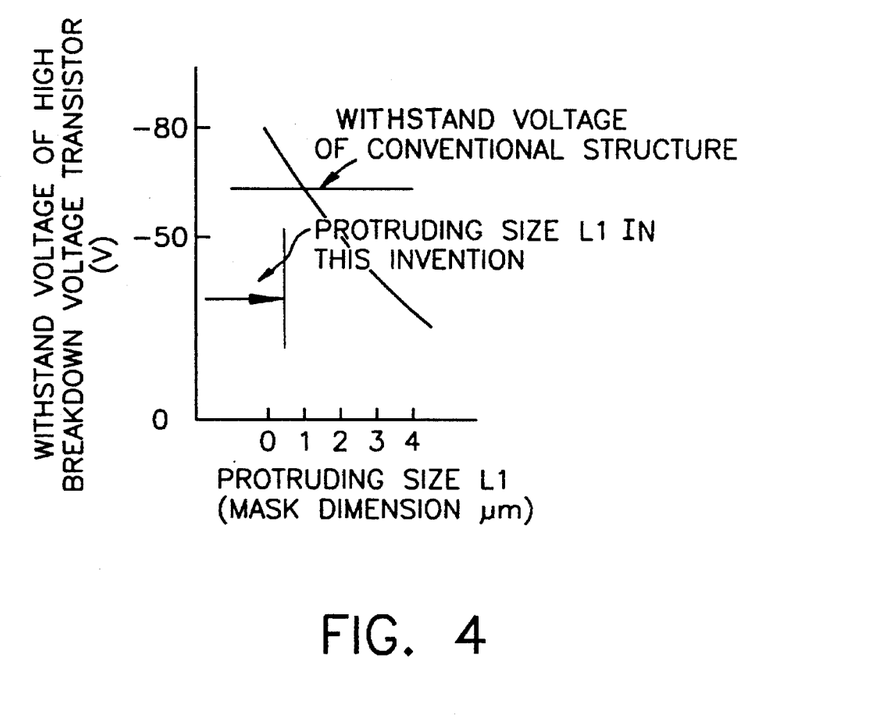
FIG. 4 is a diagram showing a relation between withdraw voltage of a high breakdown voltage transistor and protruding size in a lateral direction.

FIG. 4 shows a relation between the protruding size L1 in the lateral direction and the breakdown voltage of the high breakdown voltage transistor. The characteristics of the semiconductor device having a conventional structure is also shown in FIG. 4. Where the protruding size L1 is equal to or less than 1 micron meter, improvement of the breakdown voltage can be seen in comparison with the conventional structure. Where the protruding size L1 is greater than 1 micron meter, it is turned out that the breakdown voltage is degraded. According to this, positional relations to improve the breakdown voltage are represented by formulas L2>L1 and L3> L1>0. In other words, the protruding size L1 in the lateral direction is smaller than the protruding size L2 in the vertical direction, and the offset size L3 is set to be longer enough than the size L1.

Figure 5:
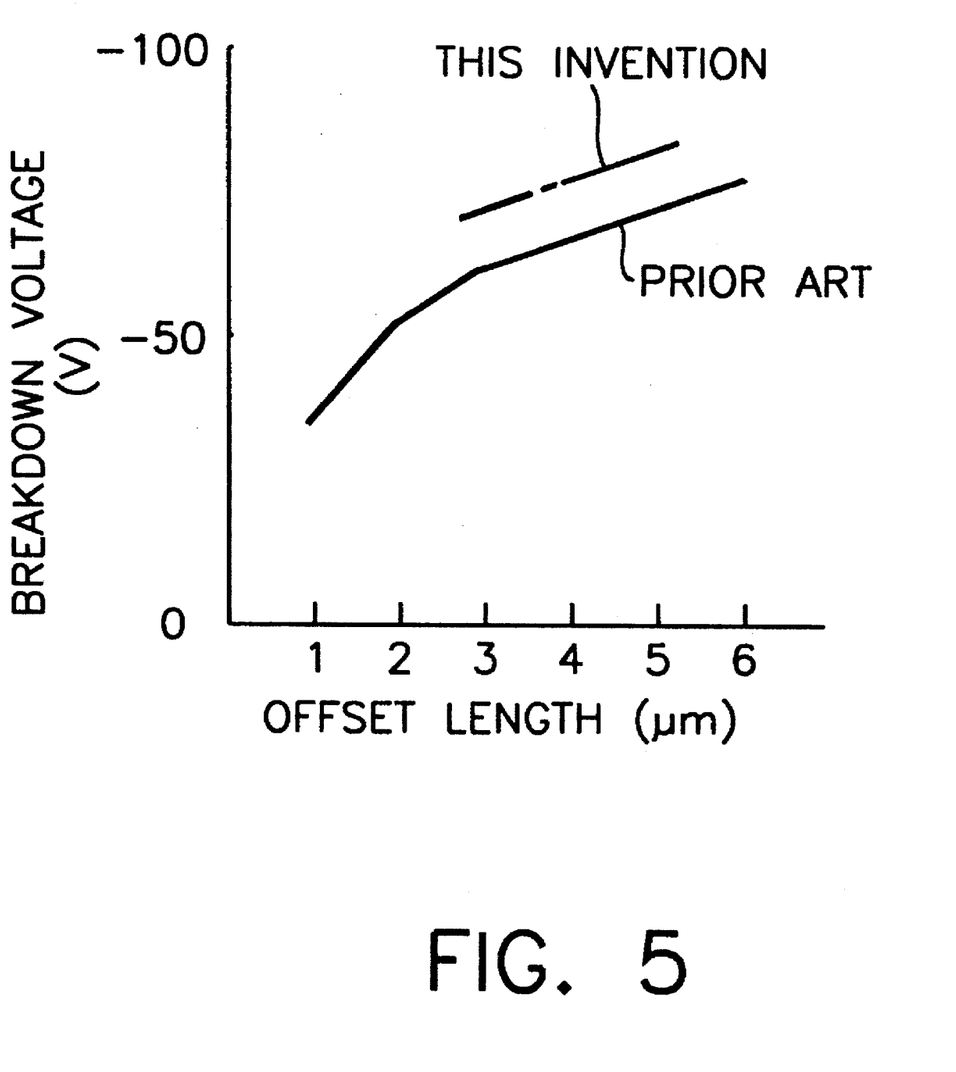
FIG. 5 is a diagram showing a relation between withdraw voltage of a high breakdown voltage transistor and offset size.

In FIG. 5, the relationship between the breakdown voltage of the high breakdown voltage transistor and the offset size L3. The gate length and the offset size L3 mainly determines the size of the high breakdown voltage transistor. The characteristics of the semiconductor device having a conventional structure is also shown in FIG. 5. As shown in FIG. 5, in the case that the offset size L3 is 4 micron meters, forming the lightly doped diffused layer 13 allows the breakdown voltage to increase by about 10 Volt, though the breakdown voltage of the high breakdown voltage transistor having the conventional structure remains at around 65 Volt. The breakdown voltage of the conventional structure is about −65 Volt, where the offset size L3 is 4 micron meters. Although the voltage of an external power supply for driving a fluorescent display tube is about −30 Volt, necessary voltage in terms of reliability is about −60 Volt in consideration of pulses of noise, or spikes, due to floating capacitance. Accordingly, if the offset size L3 is set to 3 micron meters or less, its reliability is not guaranteed. In consideration of dispersion on the process of fabricating, the offset size L3 used to be required to be set to about 4 micron meters, and it was difficult to shrink more than that. However, the offset size L3 can be reduced from 4 micron meters to 3 micron meters according to the invention. The breakdown voltage at that time is 65 Volt or greater, and the characteristics in association with its reliability is guaranteed. In other words, the scale of the high breakdown voltage semiconductor device can be more reduced.

FIG. 6 shows a flow of diffusion processes for describing a method of fabricating a high breakdown voltage semiconductor device as a third embodiment of the invention.

Figures 6A, 6B:
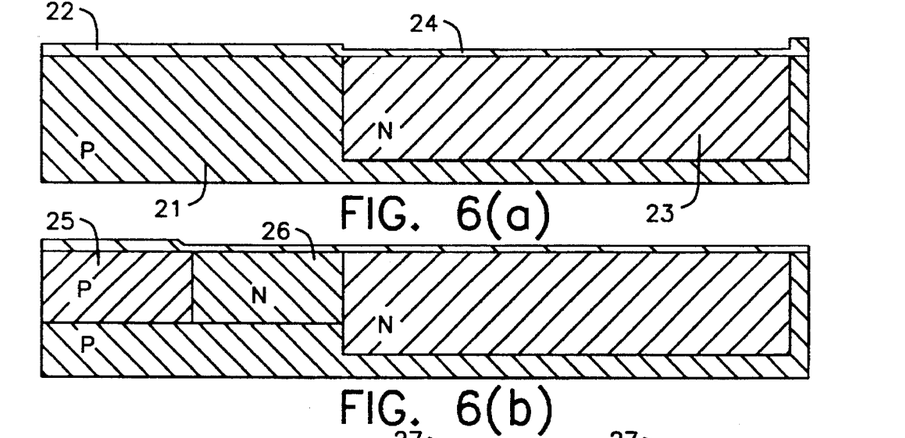
Figure 6C:
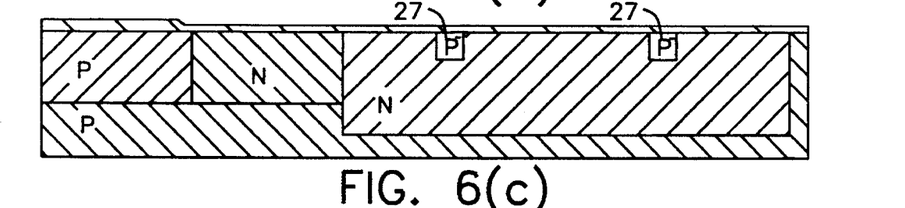

In this embodiment, a p-type semiconductor body is used for a semiconductor substrate 21 whose specific resistance is in a range from 10 to 15 ohm-cm. An n-type semiconductor substrate, however, can be used. In the case where the p-type semiconductor substrate 21 is used, a deep n-well is formed and then p-type high breakdown voltage semiconductor device is formed therein. In the case where the n-type semiconductor substrate is used, the deep n-well is unnecessary.

As shown in FIG. 6(*a*), a thick oxide film 22 is firstly formed on the surface of the semiconductor substrate 21. The oxide film 22 of a region for forming a deep n-well 23 is etched off. Then, a thin oxide film 24 is formed, and using the thick oxide film 22 as a mask, phosphorus ions are introduced by ion implantation. After removing a resist, a diffusion step is conducted for sixty and several hours at the temperature of 1,200° C.

As shown in FIG. 6(*b*), after removing the oxide films 22, 24 on the surface, a thin oxide film and $Si_3N_4$ or silicon nitride film are formed, and then, the SiN film of a region for p-well region 25 is removed. Then, boron ions are implanted and diffused at oxidizing atmosphere. After the $Si_3N_4$ film is removed, a resist mask covers the surface so as to open the area for an n-well region 26. After phosphorus ions are introduced, another diffusion step is conducted for 3 to 5 hours at the temperature of 1,200° C.

As shown in FIG. 6(*c*), in order to form a p-type lightly doped diffused layer 27 of the high breakdown voltage portion, boron ions are introduced by ion implantation into regions for the high breakdown voltage resistor and the high breakdown voltage transistor using a resist mask. A heat treatment is conducted for about one hour at the temperature of 1,200° C. At this time, it is desirable that diffused depth of the deep n-well 23 is about 10 micron meters, that diffused depth of the well diffused layer for CMOS is about 3 to 5 micron meters, and that diffused depth of the p-type lightly doped diffused layer 27 of the high breakdown voltage portion is about 1 to 3 micron meters.

Figure 6D:
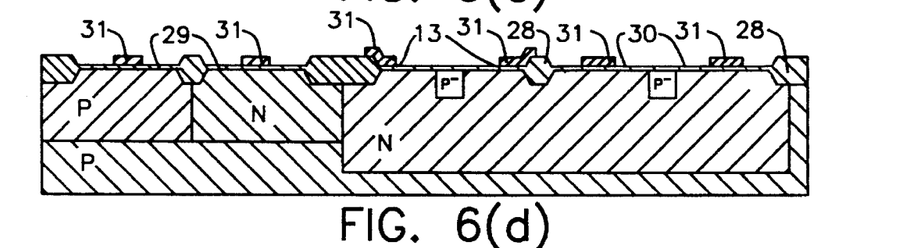

As shown in FIG. 6(d), after forming a thick oxide film 23 for device isolation, a gate oxide film 29 is formed. A gate oxide film 30 of the high breakdown voltage portion is made to be thicker than that of the ordinary transistor. Next, a polysilicon film 31 as a gate electrode is formed. Using a resist as a mask, a pattern of the gate electrode is obtained by etching.

Figure 6E:
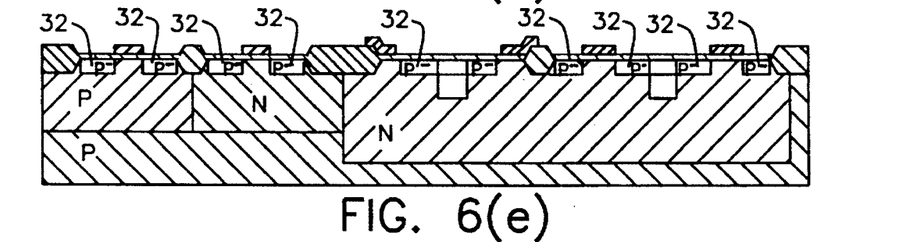

As shown in FIG. 6(e), a p-type lightly doped diffused layer 32 as an offset diffused layer of the high breakdown voltage portion is formed. To from the p-type lightly doped diffused layer 32, boron ions are implanted into the entire face with no resist mask. The reason that the lightly doped diffused layer 32 as the offset diffused layer is formed before side wall films 33 at the side walls of the gate electrode are formed is to extend the diffused depth of the lightly doped diffused layer 32 in order to improve the breakdown voltage and in order to obtain a large amount of output current of the high breakdown voltage transistor.

Figure 6F:
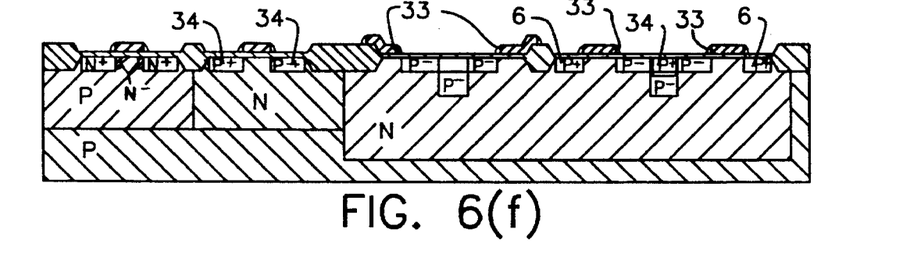

As shown in FIG. 6(f), opening a window at a region for the nMOS transistor, phosphorus ions are introduced to form LDD (Lightly Doped Drain) structure, and then light heat treatment is conducted. Then, the side wall films 33 are formed at the side walls of the gate electrode. To form a p-type heavily doped drain layer 34, arsenic ions are implanted using a resist as a mask. Then, removing the resist, $BF_2$ ions are implanted using a resist again as a mask. The p-type heavily doped drain layer 34 is formed in a manner thus described.

Next, removing the resist, a thin oxide film is formed. A thin $Si_3N_4$ film is then formed, and an interlayer insulating film such as a BPSG film is formed. Then, heat treatment is conducted at the temperature about 900° C. Contact holes are opened in the interlayer insulating film, and then, a metal interconnection layer are formed. A passivation film is formed over the metal interconnection layer.

As described above, realizing the high breakdown voltage semiconductor device and the method of fabricating the device according to the invention provides an effect on the device's scale of the high breakdown voltage input and output circuit of the high breakdown voltage semiconductor device, in particular, on scale-down of the high breakdown voltage transistor. Providing the lightly doped diffused layer suppressing the protruding size in the lateral direction at the drain allows the size of the semiconductor device to be shrink. Moreover, this invention provides the high breakdown voltage semiconductor device whose characteristics of the breakdown voltage is not impaired.

Therefore, the spirit and scope of the appended claims should not be limited to the description of the preferred versions contained herein.

What is claimed is:

1. A high breakdown voltage MOS type transistor having a drain offset structure, comprising:

a semiconductor substrate of a first conductivity type;

a source region formed in the semiconductor substrate, said source region including a heavily doped diffused layer of a second conductivity type formed in the semiconductor substrate;

an offset drain region formed in the semiconductor substrate, said offset drain region including a heavily doped drain diffused layer of the second conductivity type, a first lightly doped diffused layer of the second conductivity type so as to surround the heavily doped drain diffused layer, and a second lightly doped diffused layer of the second conductivity type formed as an offset diffused layer in the semiconductor substrate so as to be adjacent to the heavily doped diffused layer and form the drain offset structure, the first lightly doped diffused layer having a deeper diffusion depth than that of the heavily doped diffused layer in the drain region, the second lightly diffused layer having an impurity concentration for determining an offset resistance in the offset drain structure and the first lightly doped diffused layer having an impurity concentration for increasing locally the impurity concentration of the second lightly doped diffused layer only at edge portions of the second lightly doped diffused layer contiguous to the heavily doped drain diffused layer for relaxation of electric field intensity at the edge portions;

a gate electrode disposed on the semiconductor substrate so as to electrically bridge a path between the source region and the offset drain region via the second lightly doped diffused layer as the offset diffused layer;

wherein the first lightly doped diffused layer in the drain region has a laterally protruding size L1 extending from a wall of the heavily doped diffused layer in the offset drain region to an opposite wall of the first lightly doped diffused layer, a vertically protruding size L2 extending from a bottom of the heavily doped drain diffused layer in the offset drain region to a bottom of the first lightly doped diffused layer, and the second lightly doped diffused layer has an offset size L3 extending from a side of the heavily doped drain diffused layer in the offset drain region to an opposite side of the second lightly doped diffused layer; and wherein a size relationship among L1, L2 and L3 is established for improvement of breakdown voltage characteristics as follows L2>L1 and L3>L1>1, and wherein L1 is 1 micron meter or less.

2. A high breakdown voltage MOS type transistor as set forth in claim 1, wherein the heavily doped diffused layer has a diffusion depth in a range from 0.3 to 0.6 micron meters.

3. A high breakdown voltage MOS type transistor as set forth in claim 1, wherein the heavily doped diffused layer has an impurity concentration in a range of $10^{19}$ to $10^{20}$ impurities/$cm^3$.

4. A high breakdown voltage MOS type transistor as set forth in claim 1, wherein the second lightly doped diffused layer has a width of 4 micron meters or greater.

5. A high breakdown voltage MOS type transistor as set forth in claim 1, wherein the second lightly doped diffused layer has a depth in a range from 0.2 to 1 micron meters.

6. A high breakdown voltage MOS type transistor as set forth in claim 1, wherein the second lightly doped diffused layer has an impurity concentration of about $10^{16}$ impurities/$cm^3$.

7. A high breakdown voltage MOS type transistor as set forth in claim 1 wherein an edge of the second lightly doped diffused layer is located to reach an edge of the gate electrode.

8. A high breakdown voltage MOS type transistor as set forth in claim 1, wherein a location of an edge of the first lightly doped diffused layer and a location of an edge of the gate electrode are spaced by greater than 4 micron meters.

9. A high breakdown semiconductor device containing a high breakdown voltage MOS type transistor of a drain offset structure and a high breakdown voltage diffused resistor in separate areas of a semiconductor substrate of a first conductivity type, said high breakdown voltage MOS type transistor comprising:

a source region formed in the semiconductor substrate, said source region including a heavily doped diffused layer of a second conductivity type formed in the semiconductor substrate;

an offset drain region formed in the semiconductor substrate, said offset drain region including a heavily doped drain diffused layer of the second conductivity type, a first lightly doped diffused layer of the second conductivity type formed so as to surround the heavily doped drain diffused layer, and a second lightly doped diffused layer of the second conductivity type formed as an offset diffused layer in the semiconductor substrate so as to be adjacent to the heavily doped drain diffused layer and form the drain offset structure, the first lightly doped diffused layer having a deeper diffusion depth than that of the heavily doped diffused layer in the drain region, the second lightly diffused layer having an impurity concentration for determining an offset resistance in the offset drain structure and the first lightly doped diffused layer having an impurity concentration for increasing locally the impurity concentration of the second lightly doped diffused layer only at edge portions of the second lightly doped diffused layers contiguous to the heavily doped drain diffused layer for relaxation of electric field intensity at the edge portions;

a gate electrode disposed on the semiconductor substrate so as to electrically bridge a path between the source region and the offset drain region via the second lightly doped diffused layer;

wherein the first lightly doped diffused layer in the drain region has a laterally protruding size L1 extending from a wall of the heavily doped drain diffused layer in the offset drain region to an opposite wall of the first lightly doped diffused layer, a vertically protruding size L2 extending from a bottom of the heavily doped diffused layer in the offset drain region to a bottom of the first lightly doped diffused layer, and the second lightly doped diffused layer has an offset size L3 extending from a side of the heavily doped drain diffused layer in the offset drain region to an opposite side of the second lightly doped diffused layer; and wherein a size relationship among L1, L2 and L3 is established for improvement of breakdown voltage characteristics as follows L2>L1 and L3>L1>0, and wherein L1 is 1 micron meter or less, and
said high breakdown voltage diffused resistor comprising:

a first lightly doped diffused layer of the second conductivity type formed in the semiconductor substrate; and a second lightly doped diffused layer of the second conductivity type formed so as to be adjacent to the first lightly doped diffused layer and control a resistance value of the first lightly doped diffused layer, the first lightly doped diffused layer having a deeper diffusion depth than that of the second lightly doped diffused layer.

10. A high breakdown voltage semiconductor device as set forth in claim 9 wherein the first lightly doped diffused layer in the high breakdown voltage diffused resistor has a diffusion depth in a range from 1 to 3 micron meters.

11. A high breakdown voltage semiconductor device as set forth in claim 9, further comprising:

a thick oxide film disposed on the semiconductor substrate at a periphery of the high breakdown voltage MOS type transistor and at a boundary between the high breakdown voltage MOS type transistor and the high breakdown voltage diffused resistor; and a second gate electrode disposed on the semiconductor device so as to surround the high breakdown voltage diffused resistor, so that the second lightly doped diffused layer of the high breakdown voltage diffused resistor is prevented form being in contact with the thick oxide film, and wherein the second gate electrode overlaps partially the thick oxide film.

12. A high breakdown voltage MOS type transistor having a drain offset structure, comprising:

an offset drain region formed in the semiconductor substrate, the offset drain region including a heavily doped diffused layer of a second conductivity type, a first lightly doped diffused layer of the second conductivity type formed so as to surround the heavily doped drain diffused layer, and a second lightly doped diffused layer of the second conductivity type formed as an offset diffused layer in the semiconductor substrate so as to surround the first lightly doped diffused layer and to form the drain offset structure, the first lightly doped diffused layer having a deeper diffusion depth than that of the heavily doped diffused layer in the offset drain region, the second lightly diffused layer having an impurity concentration for determining an offset resistance in the offset drain structure and the first lightly doped diffused layer having an impurity concentration for increasing locally the impurity concentration of the second lightly doped diffused layer contiguous to the heavily doped drain diffused layer for relaxation of electric field intensity at the edge portions, wherein the first lightly doped diffused layer in the offset drain region has a laterally protruding size L1 of 1 micrometer or less extending from a wall of the heavily doped drain diffused layer in the offset drain region to an opposite wall of the first lightly doped diffused layer, and a vertically protruding size L2 extending from a bottom of the heavily doped diffused layer in the offset drain region to a bottom of the first lightly doped diffused layer, and the second lightly doped diffused layer has an offset size L3 extending from a side of the heavily doped drain diffused layer in the offset drain region to an opposite side of the second lightly doped diffused layer, and wherein a size relationship among L1, L2 and L3 is established for improvement of breakdown voltage characteristics as follows L2>L1 and L3>L1>0;

a ring-shaped gate electrode disposed on the semiconductor substrate so as to surround the offset drain region comprising the heavily doped drain diffused layer, the first and second lightly doped diffused layers;

a source region formed in the semiconductor substrate, said source region including a heavily doped diffused layer of a second conductivity type formed in the semiconductor substrate so as to surround the gate electrode, the gate electrode electrically bridging a path between the source region and the offset drain region via the second lightly doped diffused layer; and a thick oxide film formed so as to surround a periphery of the source region, so that the thick oxide film is prevented from being in contact with the second lightly doped diffused layer.

13. A high breakdown voltage MOS type transistor having a drain offset structure, comprising:

a semiconductor substrate of a first conductivity type;

a source region formed in the semiconductor substrate, said source region including a heavily doped diffused layer of a second conductivity type formed in the semiconductor substrate;

an offset drain region formed in the semiconductor substrate, said offset drain region including a heavily doped diffused layer of the second conductivity type, a first lightly doped diffused layer of the second conductivity type formed so as to surround the heavily doped drain diffused layer, and a second lightly doped diffused layer of the second conductivity type formed as an offset diffused layer in the semiconductor substrate so as to be adjacent to the heavily doped drain diffused layer and form the drain offset structure, the first lightly doped diffused layer having a deeper diffusion depth than that of the heavily doped diffused layer in the drain region, the second lightly diffused layer having an impurity concentration for determining an offset resistance in the offset drain structure and the first lightly doped diffused layer having an impurity concentration for increasing locally the impurity concentration of the second lightly doped diffused layer only at edge portions of the second lightly doped diffused layer contiguous to the heavily doped drain diffused layer for relaxation of electric field intensity at the edge portions;

a gate electrode disposed on the semiconductor substrate so as to electrically bridge a path between the source region and the offset drain region via the second lightly doped diffused layer;

wherein the first lightly doped diffused layer in the offset drain region has a laterally protruding size L1 extending from a wall of the heavily doped drain diffused layer in the offset drain region to an opposite wall of the first lightly doped diffused layer, a vertically protruding size L2 extending from a bottom of the heavily doped diffused layer in the offset drain region to a bottom of the first lightly doped diffused layer, and the second lightly doped diffused layer has an offset size L3 extending from a side of the heavily doped diffused layer in the offset drain region to an opposite side of the second lightly doped diffused layer; and wherein a size relationship among L1, L2 and L3 is established for improvement of breakdown voltage characteristics as follows L2>L1 and L3>L1>0, and wherein L1 is a1 micron meters or less and L2 is in a range from 0.7 to 2.4 micron meters and L3 is 4 micron meters or greater.

* * * * *